United States Patent
Javadiabhari et al.

(10) Patent No.: US 12,106,182 B2
(45) Date of Patent: *Oct. 1, 2024

(54) VALIDATING AND ESTIMATING RUNTIME FOR QUANTUM ALGORITHMS

(71) Applicant: International Business Machines Corporation, Armonk, NY (US)

(72) Inventors: Ali Javadiabhari, Sleepy Hollow, NY (US); Jay M. Gambetta, Yorktown Heights, NY (US); Ismael Faro Sertage, Chappaqua, NY (US); Paul Nation, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/975,690

(22) Filed: Oct. 28, 2022

(65) Prior Publication Data
US 2023/0409938 A1    Dec. 21, 2023

Related U.S. Application Data

(63) Continuation of application No. 16/297,604, filed on Mar. 9, 2019, now Pat. No. 11,580,433.

(51) Int. Cl.
*G06N 10/00* (2022.01)
*G06F 11/07* (2006.01)
(Continued)

(52) U.S. Cl.
CPC .......... *G06N 10/00* (2019.01); *G06F 11/076* (2013.01); *G06F 11/3612* (2013.01);
(Continued)

(58) Field of Classification Search
CPC ........ G06N 10/00; G06N 10/60; G06N 10/70; G06F 11/076; G06F 11/3612;
(Continued)

(56) References Cited

U.S. PATENT DOCUMENTS

| | | | |
|---|---|---|---|
| 11,086,665 B2 * | 8/2021 | Griffin | G06F 9/542 |
| 11,494,681 B1 * | 11/2022 | Peterson | G06N 10/00 |
| 2003/0169041 A1 | 9/2003 | Coury et al. | |
| 2017/0228483 A1 | 8/2017 | Rigetti et al. | |
| 2019/0340532 A1 * | 11/2019 | Ducore | G06N 10/00 |

(Continued)

FOREIGN PATENT DOCUMENTS

JP    2018503796 A    2/2018

OTHER PUBLICATIONS

Application No. 2021543345, Notice of Allowance, Jun. 21, 2023.
Application No. 2021543345, Notice of Allowance, English Translation, Jun. 21, 2023.
List of all IBM related dockets, 2022.
(Continued)

*Primary Examiner* — James C Kerveros
(74) *Attorney, Agent, or Firm* — Garg Law Firm, PLLC; Rakesh Garg; Erik Johnson

(57) ABSTRACT

A method for validation and runtime estimation of a quantum algorithm includes receiving a quantum algorithm and simulating the quantum algorithm, the quantum algorithm forming a set of quantum gates. The method further includes analyzing a first set of parameters of the set of quantum gates and analyzing a second set of parameters of a set of qubits performing the set of quantum gates. The method further includes transforming, in response to determining at least one of the first set of parameters or the second set of parameters meets an acceptability criterion, the quantum algorithm into a second set of quantum gates.

20 Claims, 5 Drawing Sheets

(51) Int. Cl.
  *G06F 11/36* (2006.01)
  *G06F 30/20* (2020.01)
  *G06N 10/60* (2022.01)
  *G06N 10/70* (2022.01)
(52) U.S. Cl.
  CPC ............ *G06F 30/20* (2020.01); *G06N 10/60* (2022.01); *G06N 10/70* (2022.01)
(58) Field of Classification Search
  CPC ................ G06F 30/20; G06F 11/3419; G06F 11/0754; G06F 30/32; G06F 2201/81; B82Y 10/00
  USPC .......................................................... 706/46
  See application file for complete search history.

(56) References Cited

U.S. PATENT DOCUMENTS

| | | | | |
|---|---|---|---|---|
| 2020/0125402 A1* | 4/2020 | Griffin | .................. | G06F 9/5027 |
| 2020/0242207 A1* | 7/2020 | Shehab | .................. | G06N 10/00 |
| 2020/0285986 A1* | 9/2020 | Javadiabhari | .......... | G06N 10/00 |

OTHER PUBLICATIONS

Murali et al., Formal Constraint-based Compilation for Noisy Intermediate-Scale Quantum Systems, Mar. 8, 2019.
Larose, Overview and Comparison of Gate Level Quantum Software Platforms, Department of Computational Mathematics, Science, and Engineering, Michigan State University, Jul. 6, 2018.
Application No. 2020233909, Notice of Acceptance for Patent Application, Mar. 29, 2023.

* cited by examiner

VALIDATING AND ESTIMATING RUNTIME FOR QUANTUM ALGORITHMS

TECHNICAL FIELD

The present invention relates generally to a method for compilation of quantum algorithms. More particularly, the present invention relates to a method for validating and estimating runtime for quantum algorithms.

BACKGROUND

Hereinafter, a "Q" prefix in a word of phrase is indicative of a reference of that word or phrase in a quantum computing context unless expressly distinguished where used.

Molecules and subatomic particles follow the laws of quantum mechanics, a branch of physics that explores how the physical world works at the most fundamental levels. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits") to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These is and 0s act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor using superconducting qubits (IBM is a registered trademark of International Business Machines corporation in the United States and in other countries.)

A superconducting qubit includes a Josephson junction. A Josephson junction is formed by separating two thin-film superconducting metal layers by a non-superconducting material. When the metal in the superconducting layers is caused to become superconducting—e.g. by reducing the temperature of the metal to a specified cryogenic temperature—pairs of electrons can tunnel from one superconducting layer through the non-superconducting layer to the other superconducting layer. In a qubit, the Josephson junction—which functions as a dispersive nonlinear inductor—is electrically coupled in parallel with one or more capacitive devices forming a nonlinear microwave oscillator. The oscillator has a resonance/transition frequency determined by the value of the inductance and the capacitance in the qubit circuit. Any reference to the term "qubit" is a reference to a superconducting qubit circuitry that employs a Josephson junction, unless expressly distinguished where used.

The information processed by qubits is carried or transmitted in the form of microwave signals/photons in the range of microwave frequencies. The microwave signals are captured, processed, and analyzed to decipher the quantum information encoded therein. A readout circuit is a circuit coupled with the qubit to capture, read, and measure the quantum state of the qubit. An output of the readout circuit is information usable by a q-processor to perform computations.

A superconducting qubit has two quantum states $-|0\rangle$ and $|1\rangle$. These two states may be two energy states of atoms, for example, the ground ($|g\rangle$) and first excited state ($|e\rangle$) of a superconducting artificial atom (superconducting qubit). Other examples include spin-up and spin-down of the nuclear or electronic spins, two positions of a crystalline defect, and two states of a quantum dot. Since the system is of a quantum nature, any combination of the two states are allowed and valid.

For quantum computing using qubits to be reliable, quantum circuits, e.g., the qubits themselves, the readout circuitry associated with the qubits, and other parts of the quantum processor, must not alter the energy states of the qubit, such as by injecting or dissipating energy, in any significant manner or influence the relative phase between the $|0\rangle$ and $|1\rangle$ states of the qubit. This operational constraint on any circuit that operates with quantum information necessitates special considerations in fabricating semiconductor and superconducting structures that are used in such circuits.

In conventional circuits, Boolean logic gates arranged in succession manipulate a series of bits. The technology for optimizing the gate-logic for binary computations is well-known. Circuit optimization software for conventional circuits aims to increase efficiency and decrease complexity of conventional circuits. Circuit optimization software for conventional circuits functions in part by decomposing the overall desired behavior of the conventional circuit into simpler functions. The conventional circuit optimization software more easily manipulates and processes the simpler functions. The circuit optimization software generates an efficient layout of design elements on the conventional circuit. As a result, circuit optimization software for conventional circuits significantly reduces resource demands, thereby increasing efficiency and decreasing complexity.

The illustrative embodiments recognize that in quantum circuits, quantum gates manipulate qubits to perform quantum computations. Quantum gates are unitary matrix transformations acting on qubits. Due to the superposition and entanglement of qubits, quantum gates represent a $2^n$ by $2^n$ matrix, where n is the number of qubits the quantum gate manipulates. The illustrative embodiments recognize that the decomposition of such matrix transformations quickly becomes too complex to perform by hand due to the exponential increase in the size of the matrix transformations with the number of qubits. For example, quantum computers with 2 qubits require a 4 by 4 matrix operator for quantum gate representation. A quantum computer with 10 qubits require a 1024 by 1024 matrix operator for quantum gate representation. As a result of the exponential increase, manual quantum logic gate matrix transformations quickly become unmanageable as the number of qubits increases.

A quantum algorithm represents a set of instructions to be performed on a quantum computer. The illustrative embodiments recognize that quantum algorithms can be modeled as a quantum circuit. A quantum circuit is a computation model formed of a set of quantum logic gates which perform the steps of the corresponding quantum algorithm.

Quantum processors can be cloud access devices. Providers of quantum processors supply a frontend software for users to create quantum algorithms for a backend quantum processor to execute.

The illustrative embodiments further recognize that quantum gates contain error rates which affect the computation of the quantum algorithm. Each quantum gate introduces quantum noise into the quantum system which affects the state of the qubit. Quantum gate error corresponds to how accurately the quantum processor controls the superposition of states of the qubit(s) acted on by the quantum gate.

The illustrative embodiments recognize that quantum processors exhibit varying physical characteristics over a period of time. The illustrative embodiments recognize that calibration of quantum processors determines error rates for associated qubits and quantum gates of the quantum processor. The illustrative embodiments further recognize that quantum processors are often calibrated only once or twice daily. The illustrative embodiments further recognize that certain quantum algorithms may not execute on a given quantum processor due to specific error rates for the associated qubits and quantum gates.

The illustrative embodiments recognize that hardware resources for quantum processors are limited. The illustrative embodiments further recognize that compilers which transform a quantum algorithm to a quantum circuit to be executed on a quantum processor aim to create circuits which are functionally equivalent to the quantum algorithm but run with maximum efficiency on the quantum hardware. The illustrative embodiments further recognize that elimination of extraneous or unnecessary operations simplifies and creates a more efficient quantum circuit.

The illustrative embodiments recognize that hardware resources for quantum processors are limited. The illustrative embodiments further recognize that compilers which transform a quantum algorithm to a quantum circuit to be executed on a quantum processor aim to create circuits which are functionally equivalent to the quantum algorithm but run with increased efficiency on the quantum hardware.

SUMMARY

The illustrative embodiments provide a method for validation and runtime estimation of quantum algorithms. A method for validation and runtime estimation of quantum algorithms includes receiving a quantum algorithm and simulating the quantum algorithm, the quantum algorithm forming a set of quantum gates. In an embodiment, the method includes analyzing a first set of parameters of the set of quantum gates.

In an embodiment, the method includes analyzing a second set of parameters of a set of qubits performing the set of quantum gates. In an embodiment, the method includes transforming, in response to determining at least one of the first set of parameters or the second set of parameters meets an acceptability criterion, the quantum algorithm into a second set of quantum gates.

In an embodiment, the method includes comparing the quantum algorithm to a stored quantum algorithm to estimate a runtime of the quantum algorithm. In an embodiment, the method includes producing, in response to determining at least one of the first set of parameters or the second set of parameters meets an acceptability criterion, a validation ticket corresponding to a place in a queue of quantum algorithms for a quantum processor executing validated quantum algorithms.

In an embodiment, the method includes revoking, in response to a total runtime of a set of quantum algorithms submitted by the user exceeding a threshold runtime, the validation ticket. In an embodiment, the method includes notifying, in response to determining at least one parameter of the first set of parameters or the second set of parameters fails to meet an acceptability criterion, a user of the failed at least one parameter.

In an embodiment, the method includes executing the quantum algorithm with the second set of quantum gates. In an embodiment, the acceptability criterion is a threshold error rate of a quantum gate. In an embodiment, the acceptability criterion is a threshold coherence time of a qubit.

An embodiment includes a computer usable program product. The computer usable program product includes a computer-readable storage device, and program instructions stored on the storage device.

In an embodiment, the computer usable code is stored in a computer readable storage device in a data processing system, and wherein the computer usable code is transferred over a network from a remote data processing system. In an embodiment, the computer usable code is stored in a computer readable storage device in a server data processing system, and wherein the computer usable code is downloaded over a network to a remote data processing system for use in a computer readable storage device associated with the remote data processing system An embodiment includes a computer system. The computer system includes a processor, a computer-readable memory, and a computer-readable storage device, and program instructions stored on the storage device for execution by the processor via the memory.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
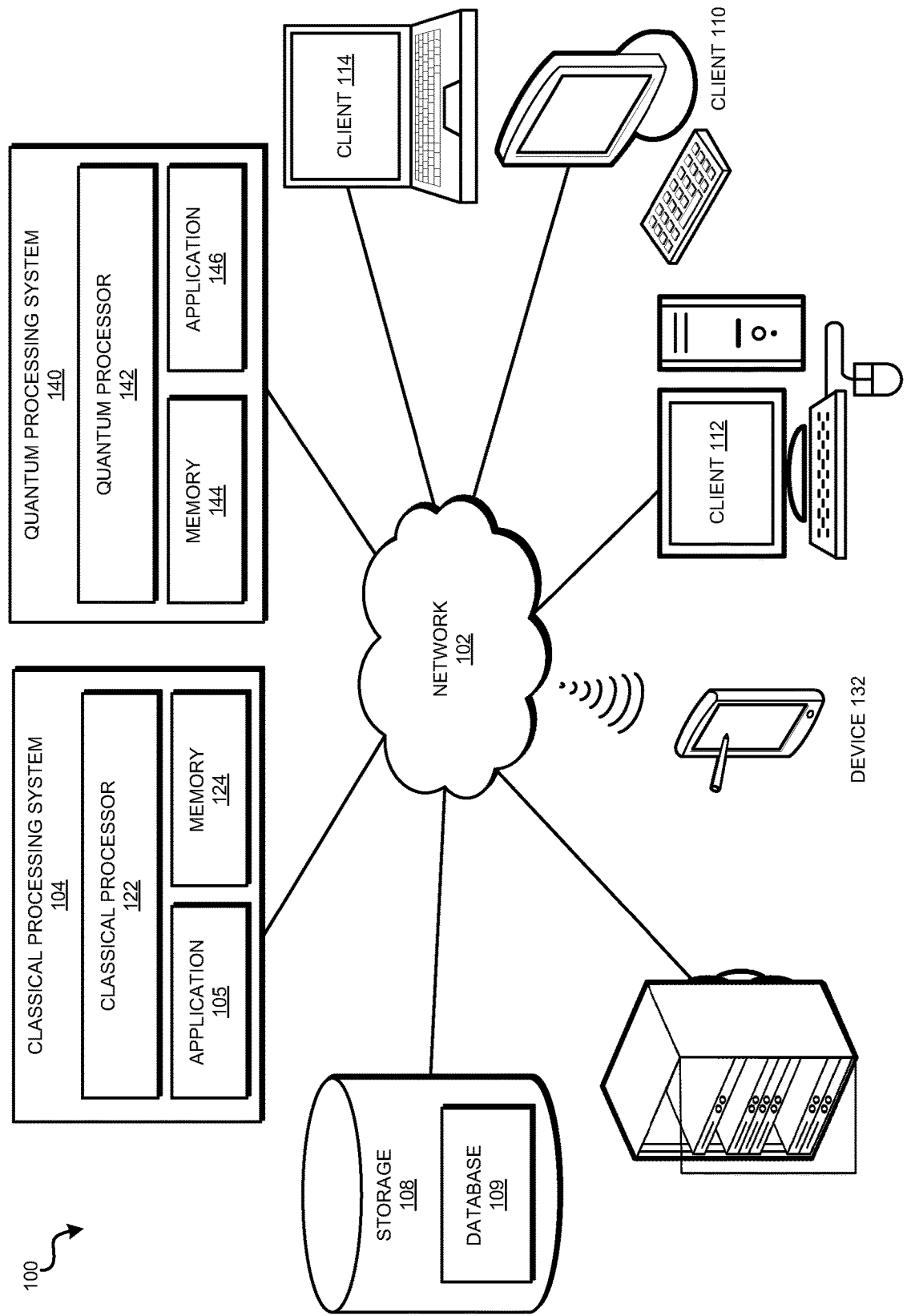
FIG. 1 depicts a block diagram of a network of data processing systems in which illustrative embodiments may be implemented.

The illustrative embodiments provide a method for validating and estimating runtime for quantum algorithms. The illustrative embodiments used to describe the invention generally address and solve the above-described needs for compilation of quantum algorithms. The illustrative embodiments provide a method for validation and runtime estimation of quantum algorithms.

An embodiment provides a method for improving compilation of a quantum circuit model of a quantum algorithm using a hybrid classical-quantum computing system. Another embodiment provides a conventional or quantum computer usable program product comprising a computer-readable storage device, and program instructions stored on the storage device, the stored program instructions comprising a method for improving compilation of a quantum circuit model using a hybrid classical-quantum computing system. The instructions are executable using a conventional or quantum processor. Another embodiment provides a computer system comprising a conventional or quantum processor, a computer-readable memory, and a computer-readable storage device, and program instructions stored on the storage device for execution by the processor via the memory, the stored program instructions comprising a method for improving compilation of a quantum circuit model using a hybrid classical-quantum computing system.

One or more embodiments provide for a mixed classical and quantum methodology that simulates a quantum circuit corresponding to a quantum algorithm. In the embodiment, the simulation gives an idealized account of the state of the quantum algorithm at each step of execution. In the embodiment, the quantum circuit corresponds to a set of quantum logic gates performing the steps of the quantum algorithm. In the embodiment, at each step of the simulated quantum circuit, quantum logic gates manipulate a state of a qubit In an embodiment, a quantum algorithm is provided to a quantum circuit compilation application. In the embodiment, the quantum circuit compilation application forms a quantum circuit having a set of quantum logic gates corresponding to steps of the quantum algorithm. In the embodiment, the quantum circuit compilation application determines a set of qubit parameters for a set of qubits on a quantum processor. In the embodiment, the quantum circuit compilation application determines a set of quantum logic gate parameters for the set of quantum logic gates. In the embodiment, the quantum circuit compilation application determines a set of quantum circuit parameters for the quantum circuit.

In the embodiment, the quantum circuit compilation application compares at least one of the set of quantum circuit parameters to at least one of the set of qubit parameters. In the embodiment, the quantum circuit compilation application compares at least one of the set of quantum circuit parameters to at least one of the set of quantum logic gate parameters.

For the clarity of the description, and without implying any limitation thereto, the illustrative embodiments are described using some example configurations. From this disclosure, those of ordinary skill in the art will be able to conceive many alterations, adaptations, and modifications of a described configuration for achieving a described purpose, and the same are contemplated within the scope of the illustrative embodiments.

Furthermore, simplified diagrams of the example logic gates, qubits, and other circuit components are used in the figures and the illustrative embodiments. In an actual fabrication or circuit, additional structures or component that are not shown or described herein, or structures or components different from those shown but for a similar function as described herein may be present without departing the scope of the illustrative embodiments.

The illustrative embodiments are described with respect to certain types of quantum logic gates, qubits, quantum processors, quantum circuits, and applications only as examples. Any specific manifestations of these and other similar artifacts are not intended to be limiting to the invention. Any suitable manifestation of these and other similar artifacts can be selected within the scope of the illustrative embodiments.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
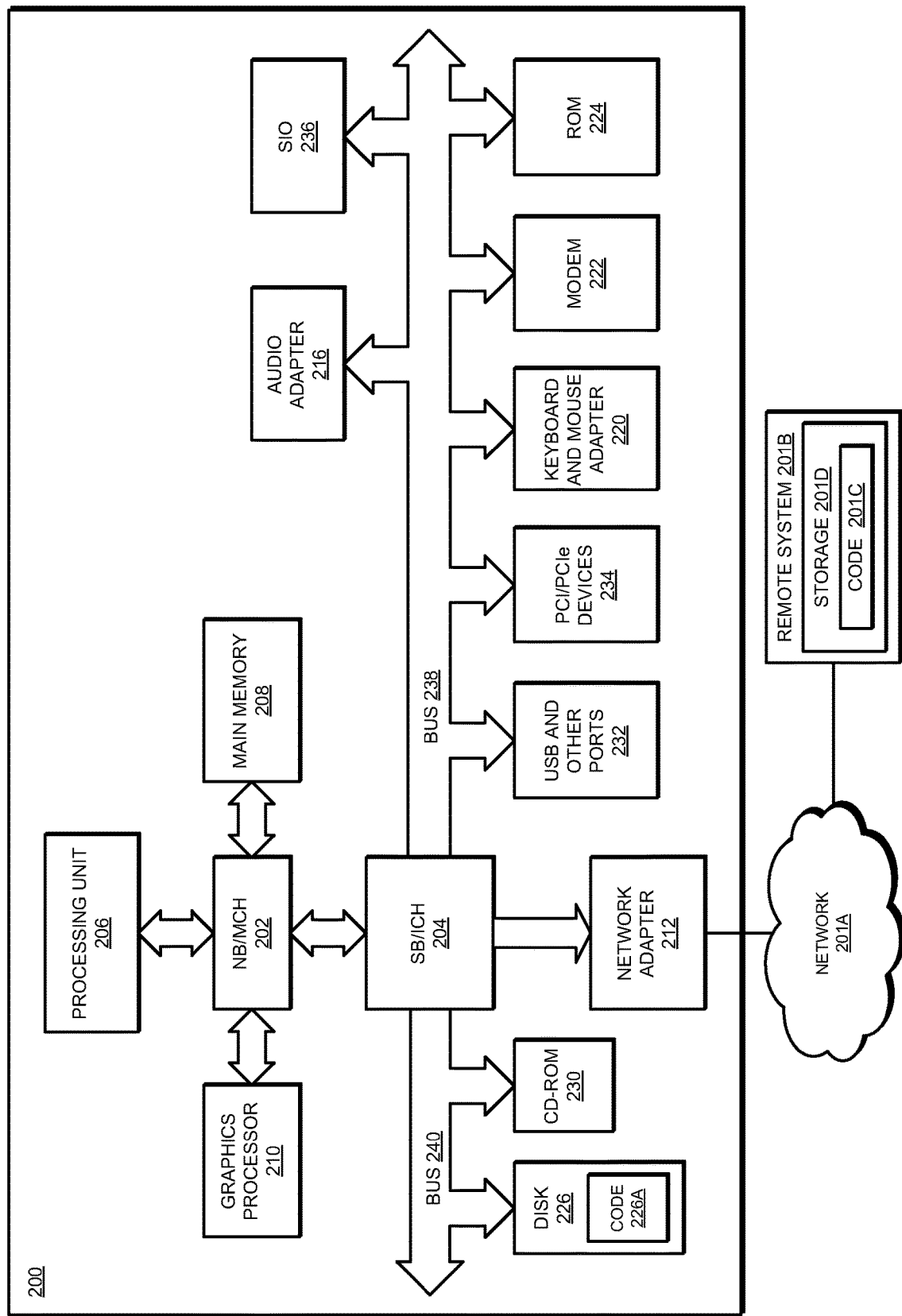
FIG. 2 depicts a block diagram of a data processing system in which illustrative embodiments may be implemented

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Classical processing system 104 couples to network 102. Classical processing system 104 is a classical processing system. Software applications may execute on any quantum data processing system in data processing environment 100. Any software application described as executing in classical processing system 104 in FIG. 1 can be configured to execute in another data processing system in a similar manner. Any data or information stored or produced in classical processing system 104 in FIG. 1 can be configured to be stored or produced in another data processing system in a similar manner. A classical data processing system, such as classical processing system 104, may contain data and may have software applications or software tools executing classical computing processes thereon.

Server 106 couples to network 102 along with storage unit 108. Storage unit 108 includes a database 109 configured to store quantum circuit designs, quantum gate parameters, quantum algorithms, and qubit parameters. Server 106 is a conventional data processing system. Quantum processing system 140 couples to network 102. Quantum processing system 140 is a quantum data processing system. Software applications may execute on any quantum data processing system in data processing environment 100. Any software application described as executing in quantum processing system 140 in FIG. 1 can be configured to execute in another quantum data processing system in a similar manner. Any data or information stored or produced in quantum processing system 140 in FIG. 1 can be configured to be stored or produced in another quantum data processing system in a similar manner. A quantum data processing system, such as quantum processing system 140, may contain data and may have software applications or software tools executing quantum computing processes thereon.

Clients 110, 112, and 114 are also coupled to network 102. A conventional data processing system, such as server 106, or client 110, 112, or 114 may contain data and may have software applications or software tools executing conventional computing processes thereon.

Only as an example, and without implying any limitation to such architecture, FIG. 1 depicts certain components that are usable in an example implementation of an embodiment. For example, server 106, and clients 110, 112, 114, are depicted as servers and clients only as example and not to imply a limitation to a client-server architecture. As another example, an embodiment can be distributed across several conventional data processing systems, quantum data processing systems, and a data network as shown, whereas another embodiment can be implemented on a single conventional data processing system or single quantum data processing system within the scope of the illustrative embodiments. Conventional data processing systems 106, 110, 112, and 114 also represent example nodes in a cluster, partitions, and other configurations suitable for implementing an embodiment.

Device 132 is an example of a conventional computing device described herein. For example, device 132 can take the form of a smartphone, a tablet computer, a laptop computer, client 110 in a stationary or a portable form, a wearable computing device, or any other suitable device. Any software application described as executing in another conventional data processing system in FIG. 1 can be configured to execute in device 132 in a similar manner. Any data or information stored or produced in another conventional data processing system in FIG. 1 can be configured to be stored or produced in device 132 in a similar manner.

Server 106, storage unit 108, classical processing system 104, quantum processing system 140, and clients 110, 112, and 114, and device 132 may couple to network 102 using wired connections, wireless communication protocols, or other suitable data connectivity. Clients 110, 112, and 114 may be, for example, personal computers or network computers.

In the depicted example, server 106 may provide data, such as boot files, operating system images, and applications to clients 110, 112, and 114. Clients 110, 112, and 114 may be clients to server 106 in this example. Clients 110, 112, 114, or some combination thereof, may include their own data, boot files, operating system images, and applications. Data processing environment 100 may include additional servers, clients, and other devices that are not shown.

In the depicted example, memory 124 may provide data, such as boot files, operating system images, and applications to classical processor 122. Classical processor 122 may include its own data, boot files, operating system images, and applications. Data processing environment 100 may include additional memories, quantum processors, and other devices that are not shown. Memory 124 includes application 105 that may be configured to implement one or more of the classical processor functions described herein for compiling quantum algorithms in accordance with one or more embodiments.

In the depicted example, memory 144 may provide data, such as boot files, operating system images, and applications to quantum processor 142. Quantum processor 142 may include its own data, boot files, operating system images, and applications. Data processing environment 100 may include additional memories, quantum processors, and other devices that are not shown. Memory 144 includes application 146 that may be configured to implement one or more of the quantum processor functions described herein in accordance with one or more embodiments.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a conventional client data processing system and a conventional server data processing system. Data processing environment 100 may also employ a service oriented architecture where interoperable software components distributed across a network may be packaged together as coherent business applications. Data processing environment 100 may also take the form of a cloud, and employ a cloud computing model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service.

With reference to FIG. 2, this figure depicts a block diagram of a data processing system in which illustrative embodiments may be implemented. Data processing system 200 is an example of a conventional computer, such as classical processing system 104, server 106, or clients 110, 112, and 114 in FIG. 1, or another type of device in which computer usable program code or instructions implementing the processes may be located for the illustrative embodiments.

Data processing system 200 is also representative of a conventional data processing system or a configuration therein, such as conventional data processing system 132 in FIG. 1 in which computer usable program code or instructions implementing the processes of the illustrative embodiments may be located. Data processing system 200 is described as a computer only as an example, without being limited thereto. Implementations in the form of other devices, such as device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system for any type of computing platform, including but not limited to server systems, personal computers, and mobile devices. An object oriented or other type of programming system may operate in conjunction with the operating system and provide calls to the operating system from programs or applications executing on data processing system 200.

Instructions for the operating system, the object-oriented programming system, and applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. in another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a mobile or wearable device.

Where a computer or data processing system is described as a virtual machine, a virtual device, or a virtual component, the virtual machine, virtual device, or the virtual component operates in the manner of data processing system 200 using virtualized manifestation of some or all components depicted in data processing system 200. For example, in a virtual machine, virtual device, or virtual component, processing unit 206 is manifested as a virtualized instance of all or some number of hardware processing units 206 available in a host data processing system, main memory 208 is manifested as a virtualized instance of all or some portion of main memory 208 that may be available in the host data processing system, and disk 226 is manifested as a virtualized instance of all or some portion of disk 226 that may be available in the host data processing system. The host data processing system in such cases is represented by data processing system 200.

Figure 3:
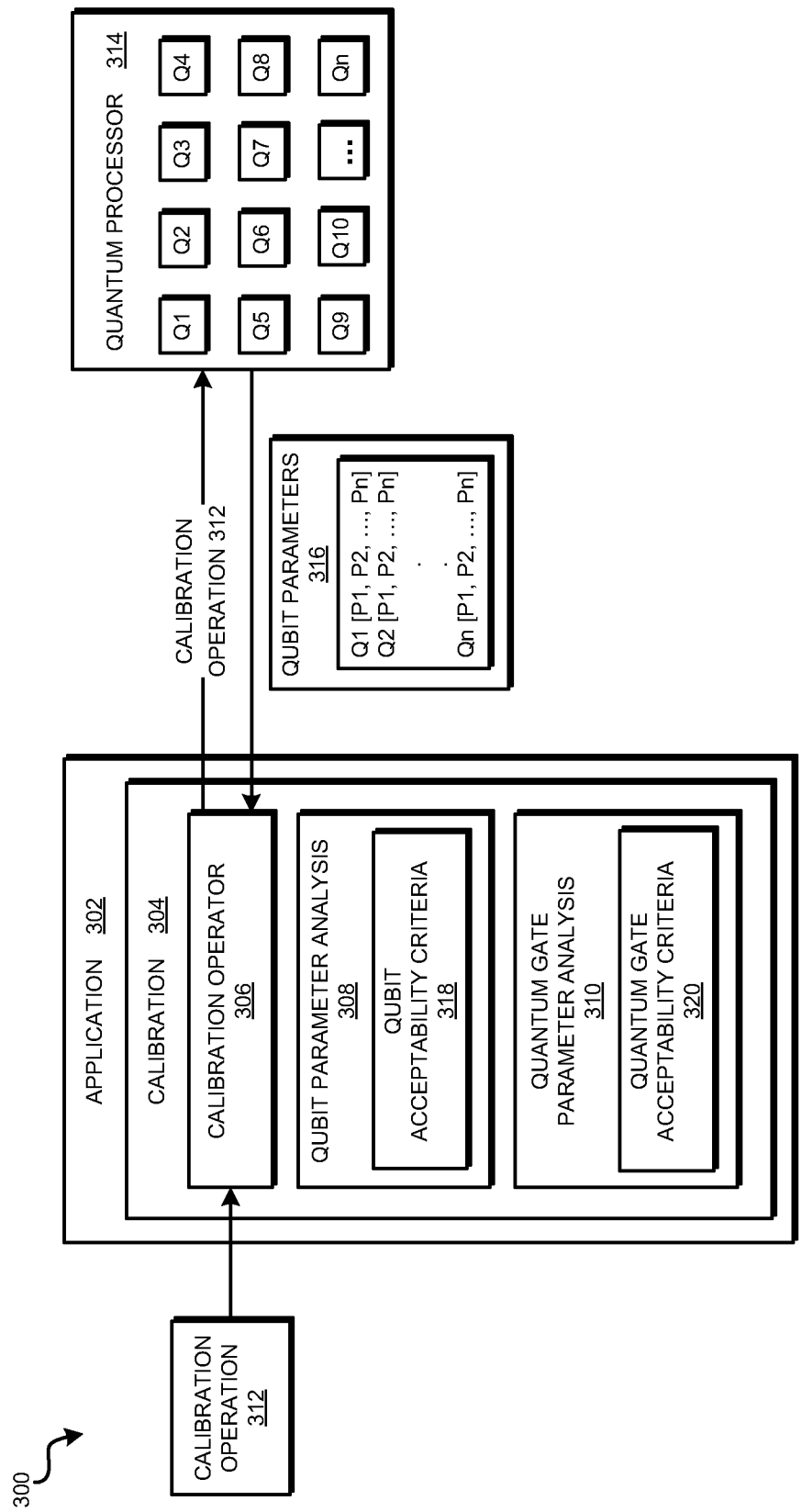
FIG. 3 depicts an example configuration of constant folding for compilation of quantum algorithms in accordance with an illustrative embodiment.

With reference to FIG. 3, this figure depicts an example configuration for calibration of a quantum processor in accordance with an illustrative embodiment. The example embodiment includes an application 302. In a particular embodiment, application 302 is an example of application 105 in FIG. 1.

Application 302 includes calibration component 304. Component 304 includes calibration operator component 306, qubit parameter analysis component 308, and quantum gate parameter analysis component 310. Application 302 receives a calibration operation 312.

Calibration operator 306 executes calibration operation 312. In an embodiment, calibration operation 312 performs a set of operations on a plurality of qubits Q1, Q2, Q3, . . . , Qn of the quantum processor 314. In an embodiment, calibration operation 312 performs a method of randomized benchmarking on the plurality of qubits. For example, calibration operation 312 can perform a set of pre-determined operations on a plurality of qubits of the quantum processor 314. The set of pre-determined operations generate a set of values for each qubit in response to performing the set of pre-determined operations. In an embodiment, calibration operator 312 compares the set of values for each qubit to an expected answer of at least one of the set of pre-determined operations.

In an embodiment, calibration operation 312 returns a set of qubit parameter values 316 for the plurality of qubits of the quantum processor 314. For example, qubit coherence time, qubit relaxation time, measurement error, and other qubit parameter values can be determined by the calibration operation. Each qubit of the quantum processor 314 can include a subset of the set of parameter values. For example, qubit Q1 can include associated parameter values P1, P2, . . . , Pn, etc. These examples of qubit parameter values are not intended to be limiting. From this disclosure, those of ordinary skill in the art will be able to conceive of many other qubit parameter values suitable for calibrating a set of qubits and the same are contemplated within the scope of the illustrative embodiments.

In an embodiment, calibration operation 312 returns a set of quantum gate parameters. For example, calibration operation 312 can return a parameter corresponding to an error rate for each quantum gate in the quantum processor 314. In an embodiment, calibration operation 312 returns a parameter corresponding to an error rate for each one and two qubit gate (primitive gate) in the quantum processor 314.

Component 308 analyzes the set of qubit parameter values 316. In an embodiment, component 308 analyzes the set of qubit parameter values 316 according to at least one of a set of qubit acceptability criteria 318. For example, component 308 can compare a parameter value of a qubit to a qubit acceptability criterion. For example, component 308 can determine a coherence time of a qubit fails to satisfy a threshold coherence time to perform a set of operations. As another example, component 308 can determine a coherence time of another qubit meets a threshold coherence time to perform the set of operations.

Component 310 analyzes a set of quantum gate parameters. In an embodiment, quantum gate parameters correspond to the set of qubits forming the quantum gate and the layout of the qubits on the quantum processor. In an embodiment, calibration operation 312 returns a set of quantum gate parameters values for a plurality of quantum gates of the quantum processor 314. For example, gate error rates, gate speeds, gate cross talk matrix, and other quantum gate parameter values can be determined by the calibration operation. Each quantum gate of the quantum processor 314 can include a subset of the set of quantum gate parameter values. These examples of quantum gate parameters are not intended to be limiting. From this disclosure, those of ordinary skill in the art will be able to conceive of many other quantum gate parameter values suitable for calibrating a set of quantum gates and the same are contemplated within the scope of the illustrative embodiments.

Component 310 analyzes the set of quantum gate parameter values. In an embodiment, component 310 analyzes the set of quantum gate parameter values according to at least one of a set of quantum gate acceptability criteria 320. For example, component 310 can compare a parameter value of a quantum gate to a quantum gate acceptability criterion. For example, component 310 can determine a gate error rate of a quantum gate fails to satisfy a threshold error rate to perform the quantum gate.

In an embodiment, component 310 generates a composite gate error rate for a composite gate from a set of primitive gate error rates, the composite gate formed from a set of primitive gates corresponding to the primitive gate error rates. In an embodiment, component 310 generates a composite gate error rate for a composite gate formed using three qubits from the formula $$\alpha = \frac{A_{123}B_{12}B_{13}B_{23}}{21}\left(\left(A_{23}B_{23}^{-1} + A_{13}B_{13}^{-1} + A_{12}B_{12}^{-1} + \frac{A_1 + A_2 + A_3}{3} + 9\right)\right),$$

where $A_{xy}$ and $B_{xy}$ are primitive gate error rates for a quantum gate formed from qubits x and y during a first calibration operation and a second calibration operation, respectively.

Figure 4:
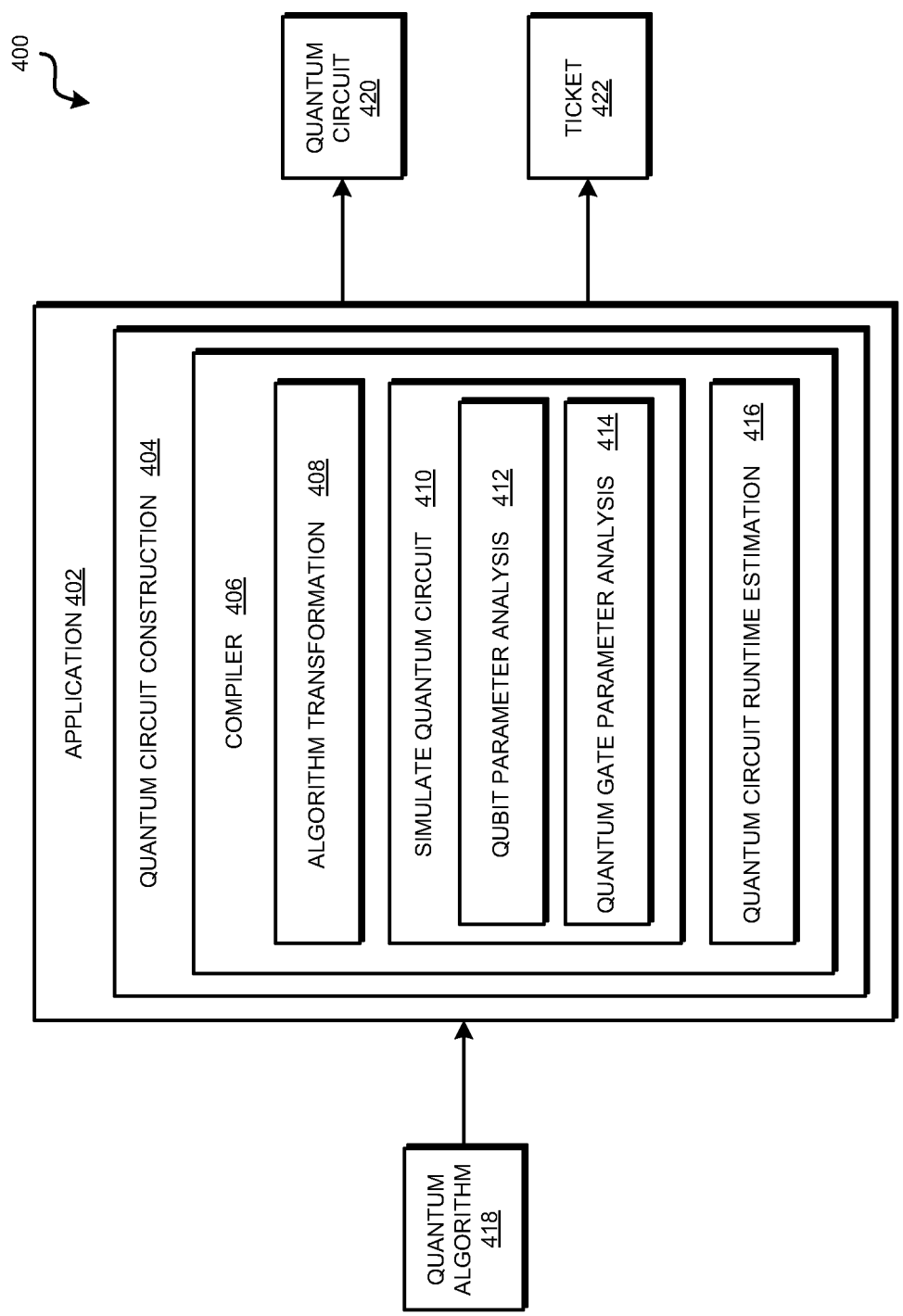
FIG. 4 depicts an example configuration of validation and runtime estimation for compilation of quantum algorithms.

With reference to FIG. 4, this figure depicts an example configuration of validation and runtime estimation for compilation of quantum algorithms. The example embodiment includes an application 402. In a particular embodiment, application 402 is an example of application 105 in FIG. 1. Application 402 includes a quantum circuit construction component 404. Quantum circuit construction component 404 compiles an output quantum circuit design 420 in accordance with an example method described herein. Compiler component 406 is configured to transform an input quantum algorithm 418 into an optimized quantum circuit design 420. Component 406 includes an algorithm transformation component 408, quantum circuit simulation component 410, and quantum circuit runtime estimation component 416.

Component 408 transforms the quantum algorithm code into a first quantum circuit design corresponding to the operations performed by the quantum algorithm. Component 410 simulates the quantum algorithm as a quantum circuit. In an embodiment, components 412 and 414 analyze the first quantum circuit to determine the set of qubits and the set of quantum gates used in the first quantum circuit. For example, component 414 determines a first qubit and a second qubit form a first quantum gate. In an embodiment, component 412 determines the first qubit performs a set of operations.

Component 412 determines whether at least one qubit satisfies at least one criterion from a set of qubit acceptability criteria. For example, component 412 can determine a coherence time of a qubit fails to satisfy a threshold coherence time to perform a set of operations. the quantum circuit in accordance with at least one of a set of acceptability criteria.

Component 414 analyzes the set of quantum gate parameter values. In an embodiment, component 414 analyzes the set of quantum gate parameter values according to at least one of a set of quantum gate acceptability criteria. For example, component 414 can compare a parameter value of a quantum gate to a quantum gate acceptability criterion. For example, component 414 can determine a gate error rate of a quantum gate fails to satisfy a threshold error rate to perform the quantum gate.

In response to determining the simulated quantum circuit satisfies a subset of the set of quantum gate acceptability criteria and a second subset of the set of qubit acceptability criteria, application 402 transforms the quantum algorithm into quantum circuit 420, quantum circuit 420 performing the operations of the quantum algorithm. Application 402 outputs validation ticket 422 and notifies the user of validation. Validation ticket 422 corresponds to a place in a queue of quantum algorithms for a quantum processor executing validated quantum algorithms.

Quantum circuit runtime estimation component 416 estimates a runtime for performing the output quantum circuit 420. In an embodiment, component 416 compares a submitted quantum algorithm to a stored quantum algorithm to estimate a runtime of the submitted quantum algorithm. For example, component 416 can compare the number of quantum gates, type of quantum gates, and quantum gate parameters to determine a runtime for the submitted quantum algorithm. Component 416 determines a total runtime for all quantum algorithms submitted by a single user. Component 416 compares the total runtime to a threshold runtime, such as one hour. For example, component 416 can determine the total runtime for quantum algorithms submitted by a single user is two hours. Component 416 determines the total runtime exceeds the threshold runtime. Component 416 revokes the ticket 422 in response to the total runtime exceeding the threshold runtime.

Figure 5:
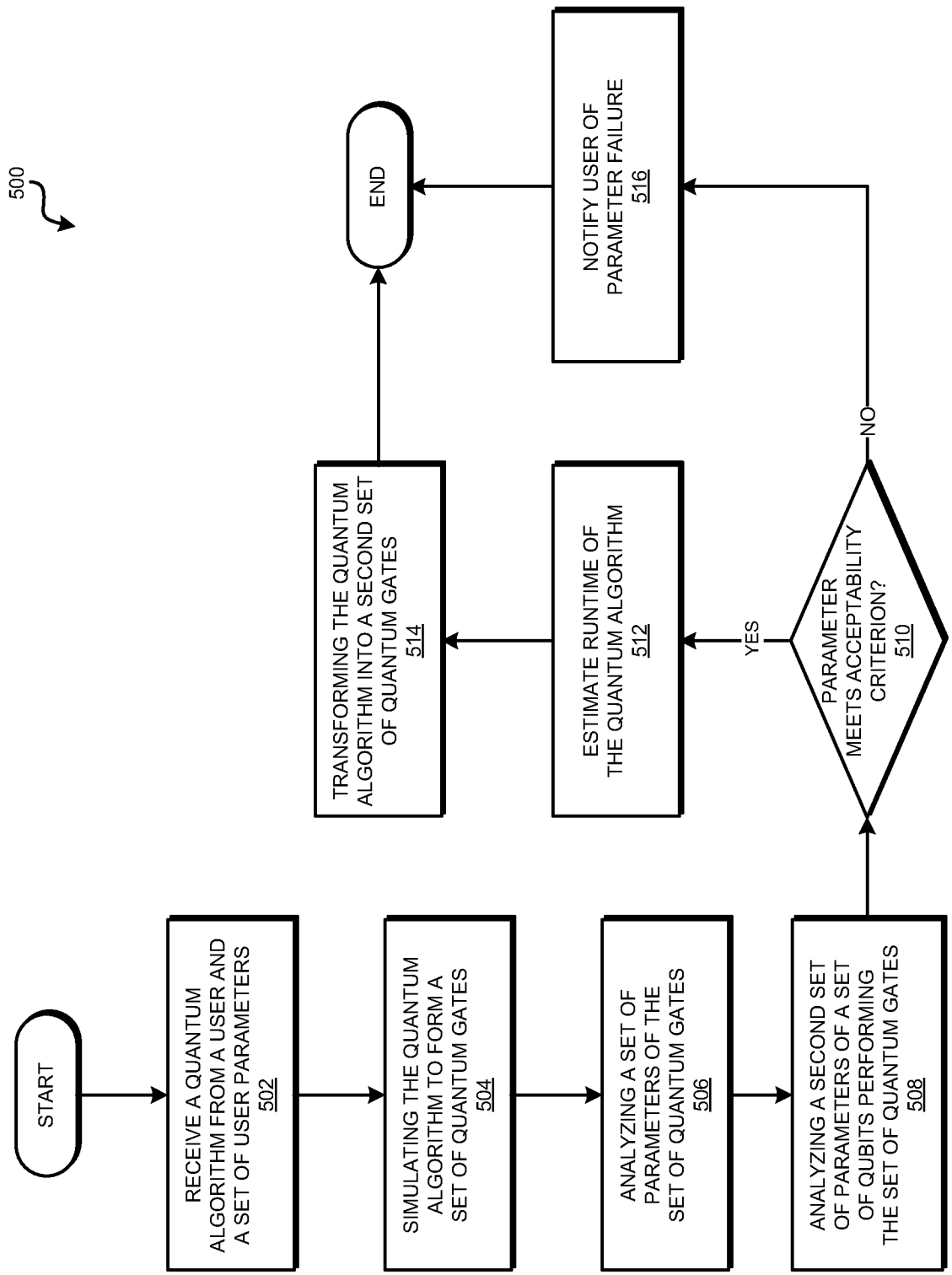
FIG. 5 depicts a flowchart of an example method for validation and runtime estimation of quantum algorithms in accordance with an illustrative embodiment.

With reference to FIG. 5, this figure depicts a flowchart of an example method for validation and runtime estimation of quantum algorithms in accordance with an illustrative embodiment. Application 105 performs method 500 in an embodiment. In block 502, application 105 receives a quantum algorithm from a user and a set of user parameters. In block 504, application 105 simulates a quantum algorithm forming a set of quantum gates performing operations of the quantum algorithm. In block 506, application 105 analyzes a set of parameters of the set of quantum gates. In block 508, application 105 analyzes a second set of parameters of a set of qubits performing the set of quantum gates. In block 510, application 105 determines whether at least one of the parameters meets an acceptability criterion. In response to determining the at least one parameter fails to meet an acceptability criterion (NO path of block 510), application 105 moves to block 516 to notify the user of parameter failure. Application 105 ends process 500 thereafter.

In response to determining the at least one parameter meets an acceptability criterion (YES path of block 510), application 105 moves to block 512. In block 512, application 105 estimates a runtime of the quantum algorithm. In block 514, application 105 transforms the quantum algorithm into a second set of quantum gates. Application 105 ends process 500 thereafter.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

Thus, a computer implemented method, system or apparatus, and computer program product are provided in the illustrative embodiments for managing participation in online communities and other related features, functions, or operations. Where an embodiment or a portion thereof is described with respect to a type of device, the computer implemented method, system or apparatus, the computer program product, or a portion thereof, are adapted or configured for use with a suitable and comparable manifestation of that type of device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method comprising:
analyzing a first set of parameters of a set of quantum gates corresponding to a quantum algorithm;
analyzing a second set of parameters of a set of qubits performing the set of quantum gates;
transforming, responsive to determining that at least one parameter from at least one of the first set of parameters and the second set of parameters satisfies an acceptability criterion, the quantum algorithm into a second set of quantum gates; and
queueing, into a queue of quantum algorithms, in response to determining at least one of the first set of parameters or the second set of parameters meets the acceptability criterion, the second set of quantum gates for execution by a quantum processor executing validated quantum algorithms.

2. The method of claim 1, further comprising:
comparing the quantum algorithm to a stored quantum algorithm to estimate a runtime of the quantum algorithm, wherein the runtime is a time period.

3. The method of claim 1, further comprising:
producing, in response to determining at least one of the first set of parameters or the second set of parameters meets the acceptability criterion, a validation ticket corresponding to a place in the queue of quantum algorithms.

4. The method of claim 3, further comprising:
revoking, in response to a total runtime of a set of quantum algorithms submitted by a user exceeding a threshold runtime, the validation ticket.

5. The method of claim 1, further comprising:
notifying, in response to determining at least one parameter of the first set of parameters or the second set of parameters fails to meet an acceptability criterion, a user of the failed at least one parameter.

6. The method of claim 1, further comprising:
executing the quantum algorithm with the second set of quantum gates.

7. The method of claim 1, wherein the acceptability criterion is a threshold error rate of a quantum gate.

8. The method of claim 1, wherein the acceptability criterion is a threshold coherence time of a qubit.

9. A computer usable program product comprising a computer-readable storage medium, and program instructions stored on the storage medium, the stored program instructions comprising:
program instructions to analyze a first set of parameters of a set of quantum gates corresponding to a quantum algorithm;
program instructions to analyze a second set of parameters of a set of qubits performing the set of quantum gates;
program instructions to transform, responsive to determining that at least one parameter from at least one of the first set of parameters and the second set of parameters satisfies an acceptability criterion, the quantum algorithm into a second set of quantum gates; and
program instructions to queue, into a queue of quantum algorithms, in response to determining at least one of the first set of parameters or the second set of parameters meets the acceptability criterion, the second set of quantum gates for execution by a quantum processor executing validated quantum algorithms.

10. The computer usable program product of claim 9, wherein the stored program instructions are stored in a computer readable storage medium in a data processing system, and wherein the computer usable code is transferred over a network from a remote data processing system.

11. The computer usable program product of claim 9, wherein the stored program instructions are stored in a computer readable storage medium in a server data processing system, and wherein the computer usable code is downloaded over a network to a remote data processing system for use in a computer readable storage medium associated with the remote data processing system.

12. The computer usable program product of claim 9, the stored program instructions further comprising:
program instructions to compare the quantum algorithm to a stored quantum algorithm to estimate a runtime of the quantum algorithm, wherein the runtime is a time period.

13. The computer usable program product of claim 9, the stored program instructions further comprising:
program instructions to produce, in response to determining at least one of the first set of parameters or the second set of parameters meets the acceptability criterion, a validation ticket corresponding to a place in the queue of quantum algorithms.

14. The computer usable program product of claim 13, the stored program instructions further comprising:
program instructions to revoke, in response to a total runtime of a set of quantum algorithms submitted by the user exceeding a threshold runtime, the validation ticket.

15. The computer usable program product of claim 9, the stored program instructions further comprising:
program instructions to notify, in response to determining at least one parameter of the first set of parameters or the second set of parameters fails to meet an acceptability criterion, a user of the failed at least one parameter.

16. The computer usable program product of claim 9, the stored program instructions further comprising:
program instructions to execute the quantum algorithm with the second set of quantum gates.

17. The computer usable program product of claim 9, wherein the acceptability criterion is a threshold error rate of a quantum gate.

18. The computer usable program product of claim 9, wherein the acceptability criterion is a threshold coherence time of a qubit.

19. A computer system comprising a processor, a computer-readable memory, and a computer-readable storage medium, and program instructions stored on the storage medium for execution by the processor via the memory, the stored program instructions comprising:

program instructions to analyze a first set of parameters of a set of quantum gates corresponding to a quantum algorithm;

program instructions to analyze a second set of parameters of a set of qubits performing the set of quantum gates;

program instructions to transform, responsive to determining that at least one parameter from at least one of the first set of parameters and the second set of parameters satisfies an acceptability criterion, the quantum algorithm into a second set of quantum gates; and program instructions to queue, into a queue of quantum algorithms, in response to determining at least one of the first set of parameters or the second set of parameters meets the acceptability criterion, the second set of quantum gates for execution by a quantum processor executing validated quantum algorithms.

20. The computer system of claim 19, the stored program instructions further comprising:

program instructions to compare the quantum algorithm to a stored quantum algorithm to estimate a runtime of the quantum algorithm, wherein the runtime is a time period.

\* \* \* \* \*